(12) United States Patent
Song et al.

(10) Patent No.: US 11,215,890 B2
(45) Date of Patent: Jan. 4, 2022

(54) ARRAY SUBSTRATE, DISPLAY PANEL AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Wenhua Song, Beijing (CN); Bo Shi, Beijing (CN); Shaning Yan, Beijing (CN); Shiqi Chen, Beijing (CN); Limiao Wang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/763,565

(22) PCT Filed: Nov. 15, 2019

(86) PCT No.: PCT/CN2019/118940
§ 371 (c)(1),
(2) Date: May 13, 2020

(87) PCT Pub. No.: WO2020/103774
PCT Pub. Date: May 28, 2020

(65) Prior Publication Data
US 2021/0247651 A1 Aug. 12, 2021

(30) Foreign Application Priority Data
Nov. 19, 2018 (CN) .......................... 201811376215.8

(51) Int. Cl.
*G02F 1/1343* (2006.01)
*G02F 1/1362* (2006.01)
(Continued)

(52) U.S. Cl.
CPC .. *G02F 1/136286* (2013.01); *G02F 1/133512* (2013.01); *G02F 1/134318* (2021.01); *G02F 1/134345* (2021.01); *H01L 27/124* (2013.01)

(58) Field of Classification Search
CPC ...................................................... G02F 1/1343
See application file for complete search history.

(56) References Cited

U.S. PATENT DOCUMENTS

| 2005/0018114 | A1  | 1/2005 | Park et al. |
|---|---|---|---|
| 2008/0151169 | A1* | 6/2008 | Park .................. G02F 1/134363 349/143 |

(Continued)

FOREIGN PATENT DOCUMENTS

| CN | 1573480 A | 2/2005 | |
|---|---|---|---|
| CN | 101937155 * | 1/2011 | ........... G02F 1/1362 |

(Continued)

OTHER PUBLICATIONS

International search report of PCT application No. PCT/CN2019/118940 dated Jan. 23, 2020.

(Continued)

*Primary Examiner* — Sang V Nguyen
(74) *Attorney, Agent, or Firm* — Fay Sharpe LLP

(57) ABSTRACT

An array substrate is provided. The array substrate includes: a base substrate which is provided with a plurality of sub-pixel regions arranged in multiple rows and columns; a plurality of data lines located on the base substrate, each of the plurality of data lines corresponding to at least one of any column of the sub-pixel regions, any row of the sub-pixel regions including a plurality of sub-pixel region pairs, each of the plurality of sub-pixel region pairs including two adjacent sub-pixel regions, any two of the plurality of sub-pixel region pairs including different sub-pixel regions, and two data lines corresponding to the two sub-pixel regions being located at different sides of the two sub-pixel (Continued)

regions in a row direction; and a common electrode and a plurality of pixel electrodes located on the base substrate.

15 Claims, 12 Drawing Sheets

(51) Int. Cl.
G02F 1/1335 (2006.01)
H01L 27/12 (2006.01)

(56) References Cited

U.S. PATENT DOCUMENTS

| | | | |
|---|---|---|---|
| 2012/0206659 A1 | 8/2012 | Tsubata et al. | |
| 2015/0236042 A1 | 8/2015 | Peng et al. | |
| 2016/0357073 A1 | 12/2016 | Zhang et al. | |
| 2016/0377932 A1 | 12/2016 | Kim et al. | |
| 2016/0377942 A1 | 12/2016 | Cheng | |
| 2017/0263170 A1 | 9/2017 | Mu | |
| 2018/0149893 A1 | 5/2018 | Qi et al. | |
| 2019/0204700 A1 | 7/2019 | Liao et al. | |
| 2019/0235333 A1* | 8/2019 | Wang | G02F 1/13439 |

FOREIGN PATENT DOCUMENTS

| | | | | |
|---|---|---|---|---|
| CN | 101937155 A | | 1/2011 | |
| CN | 102598104 A | | 7/2012 | |
| CN | 103336392 A | | 10/2013 | |
| CN | 103901684 | * | 7/2014 | ........... G02F 1/1343 |
| CN | 103901684 A | | 7/2014 | |
| CN | 204496141 U | | 7/2015 | |
| CN | 104834142 A | | 8/2015 | |
| CN | 10562961 | | 6/2016 | |
| CN | 105629611 A | | 6/2016 | |
| CN | 106371256 A | | 2/2017 | |
| CN | 106783892 A | | 5/2017 | |
| CN | 107918221 A | | 4/2018 | |
| CN | 207396936 U | | 5/2018 | |
| CN | 108254985 A | | 7/2018 | |
| CN | 109240012 A | | 1/2019 | |
| EP | 3702834 | * | 9/2020 | ........... G02F 1/1343 |
| KR | 20060019910 A | | 3/2006 | |

OTHER PUBLICATIONS

First office action of Chinese application No. 201811376215.8 dated Mar. 19, 2020.

* cited by examiner

US 11,215,890 B2

ARRAY SUBSTRATE, DISPLAY PANEL AND DISPLAY DEVICE

This application is a 371 of PCT Application No. PCT/CN2019/118940, filed Nov. 15, 2019, which claims priority to Chinese Patent Application No. 201811376215.8, filed on Nov. 19, 2018 and entitled "ARRAY SUBSTRATE, DISPLAY PANEL AND DISPLAY DEVICE", the entire contents of which are incorporated herein by reference.

TECHNICAL FIELD

The present disclosure relates to an array substrate, a display panel and a display device.

BACKGROUND

A display panel usually includes an array substrate, a color filter substrate, and a liquid crystal layer disposed between the two substrates. The array substrate may be provided with a pixel electrode and a common electrode. The pixel electrode and the common electrode may form an electric field to control a deflecting direction of liquid crystals in the liquid crystal layer so as to play a display role.

An array substrate in the related art includes a base substrate with a plurality of sub-pixel regions disposed thereon. These sub-pixel regions are arranged on the base substrate in rows and columns. A data line corresponding to any one of the sub-pixel regions is disposed on the left side of the any one of the sub-pixel regions and configured to input electrical signals to other circuit structures in this sub-pixel region. A pixel electrode and a common electrode are disposed in each sub-pixel region.

SUMMARY

In one aspect, an array substrate is provided. The array substrate includes: a base substrate, wherein the base substrate is provided with a plurality of sub-pixel regions arranged in multiple rows and columns on the base substrate;

a plurality of data lines, wherein the plurality of data lines are located on the base substrate, each of the plurality of data lines corresponds to at least one of any column of the sub-pixel regions, any row of the sub-pixel regions comprise a plurality of sub-pixel region pairs, each of the plurality of sub-pixel region pairs includes two adjacent sub-pixel regions, any two of the plurality of sub-pixel region pairs comprise different sub-pixel regions, and two data lines corresponding to the two sub-pixel regions are located at different sides of the two sub-pixel regions in a row direction; and a common electrode and a plurality of pixel electrodes, which are located on the base substrate.

In another aspect, a display panel is provided. The display panel includes a color filter substrate, a liquid crystal layer and the aforesaid array substrate. The array substrate includes: a base substrate, wherein the base substrate is provided with a plurality of sub-pixel regions arranged in multiple rows and columns on the base substrate; a plurality of data lines wherein the plurality of data lines are located on the base substrate, each of the plurality of data lines corresponds to at least one of any column of the sub-pixel regions; any row of the sub-pixel regions comprise a plurality of sub-pixel region pairs, each of the plurality of sub-pixel region pairs includes two adjacent sub-pixel regions; any two of the plurality of sub-pixel region pairs comprise different sub-pixel regions; and two data lines corresponding to the two sub-pixel regions are located at different sides of the two sub-pixel regions in a row direction; and a common electrode and a plurality of pixel electrodes, which are located on the base substrate.

In another aspect, a display device is provided. The display device includes the aforesaid display panel.

DETAILED DESCRIPTION

Embodiments of the present disclosure will be described below with reference to the drawings.

Figure 1:
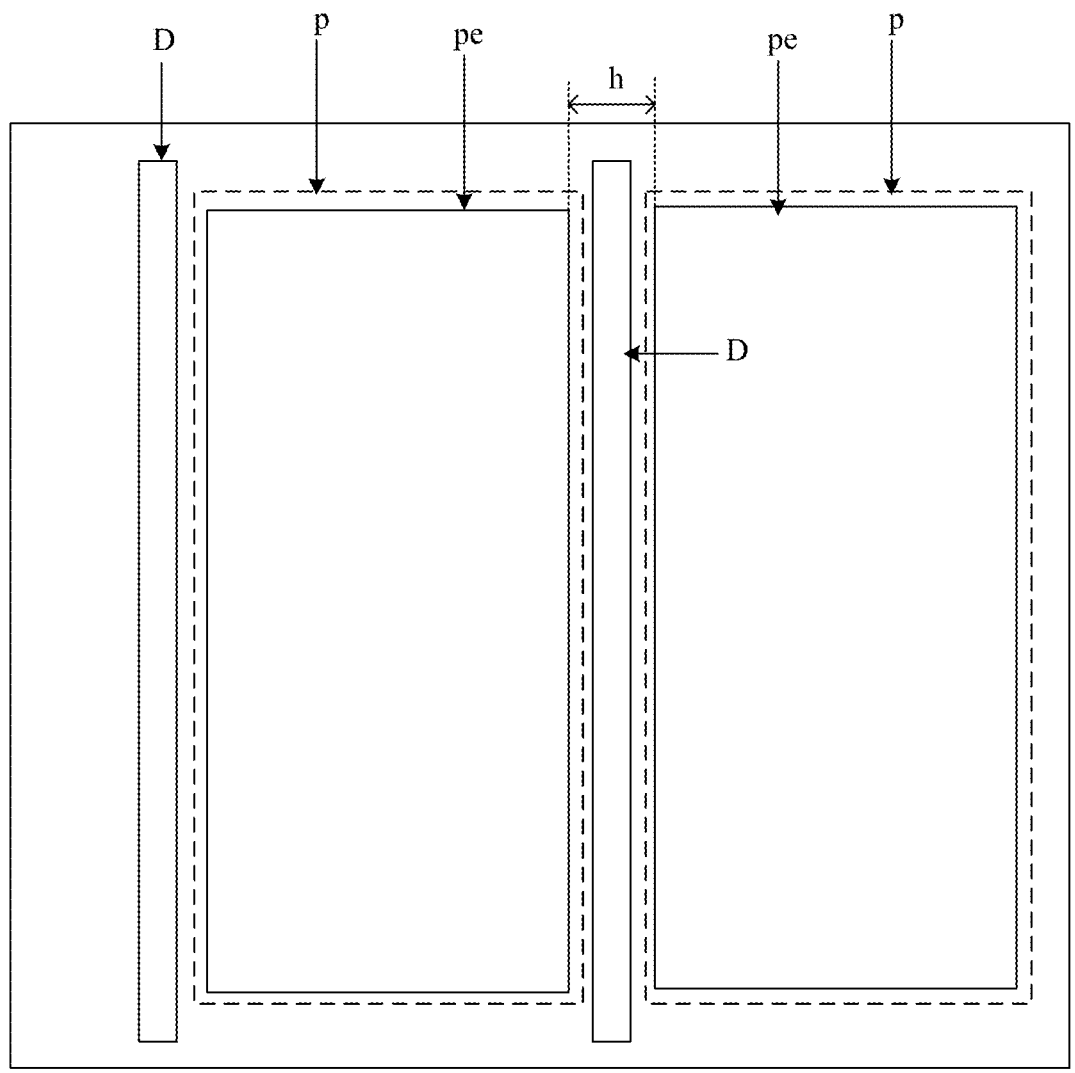
FIG. 1 is a schematic structural diagram of an array substrate.

FIG. 1 is a schematic structural diagram of an array substrate. The array substrate may include a base substrate 11. A plurality of sub-pixel regions p may be disposed on the base substrate 11. A data line D corresponding to each sub-pixel region p is disposed at the left side of the sub-pixel region p (a data line corresponding to any one of the sub-pixel regions is configured to input an electrical signal into a pixel electrode in the sub-pixel region). Various electrodes, such as a pixel electrode pe and a common electrode (not shown in FIG. 1), may be disposed in each sub-pixel region p.

Figure 2:
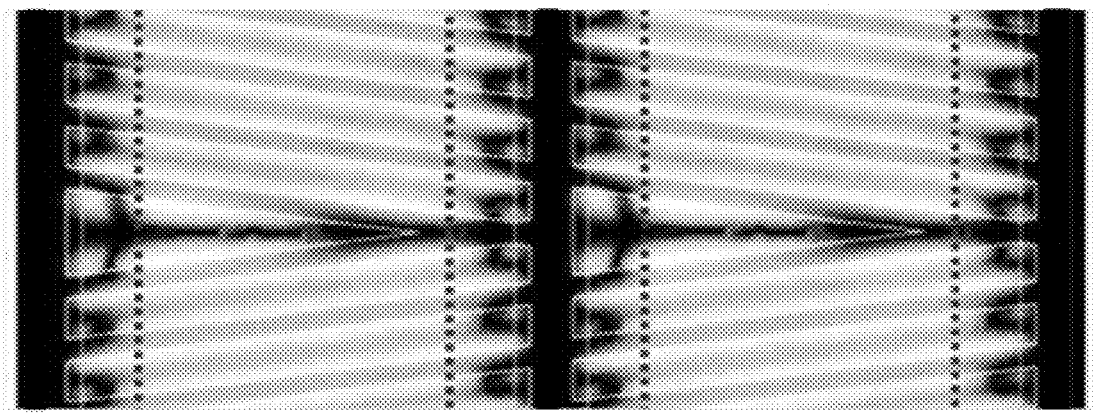
FIG. 2 is a schematic diagram showing black shadow lines of the array substrate shown in FIG. 1.

In order to prevent mutual interference due to an excessively small interval between the data line and the electrodes, no electrodes (e.g., a pixel electrode and a common electrode) are arranged at two sides of the data line, and there will be a long distance h between the pixel electrodes pe in the sub-pixel regions at two sides of the data lines. The distance h may be equal to the sum of a width of the data line and two times of an anti-interference distance (the anti-interference distance is a minimum distance by which the data line and the pixel electrodes will not affect each other, and may be usually determined by the accuracy of manufacturing processes of the data line and the pixel electrodes, that is, the anti-interference distance may be greater than or equal to a minimum distance that can be achieved by the manufacturing processes, and exemplarily, the distance may be 3.0-3.5 micrometers). This will cause a large electric-field-free region between the sub-pixel regions on the array substrate in a transverse direction. This region may have no electric field, or no electric field capable of controlling the liquid crystal layer. As a result, in a display panel made by the array substrate, there will be a large black shadow line region, which may not be displayed, between every two transverse sub-pixel regions. As shown in FIG. 2, which is a schematic structural diagram of an array substrate, white regions are the sub-pixel regions, and black regions between the white regions are black shadow lines. It can be seen that the black shadow lines are wide, which may reduce a side-view contrast ratio and the transmittance of the display panel, and seriously affects a display effect of the display panel.

Figure 3:
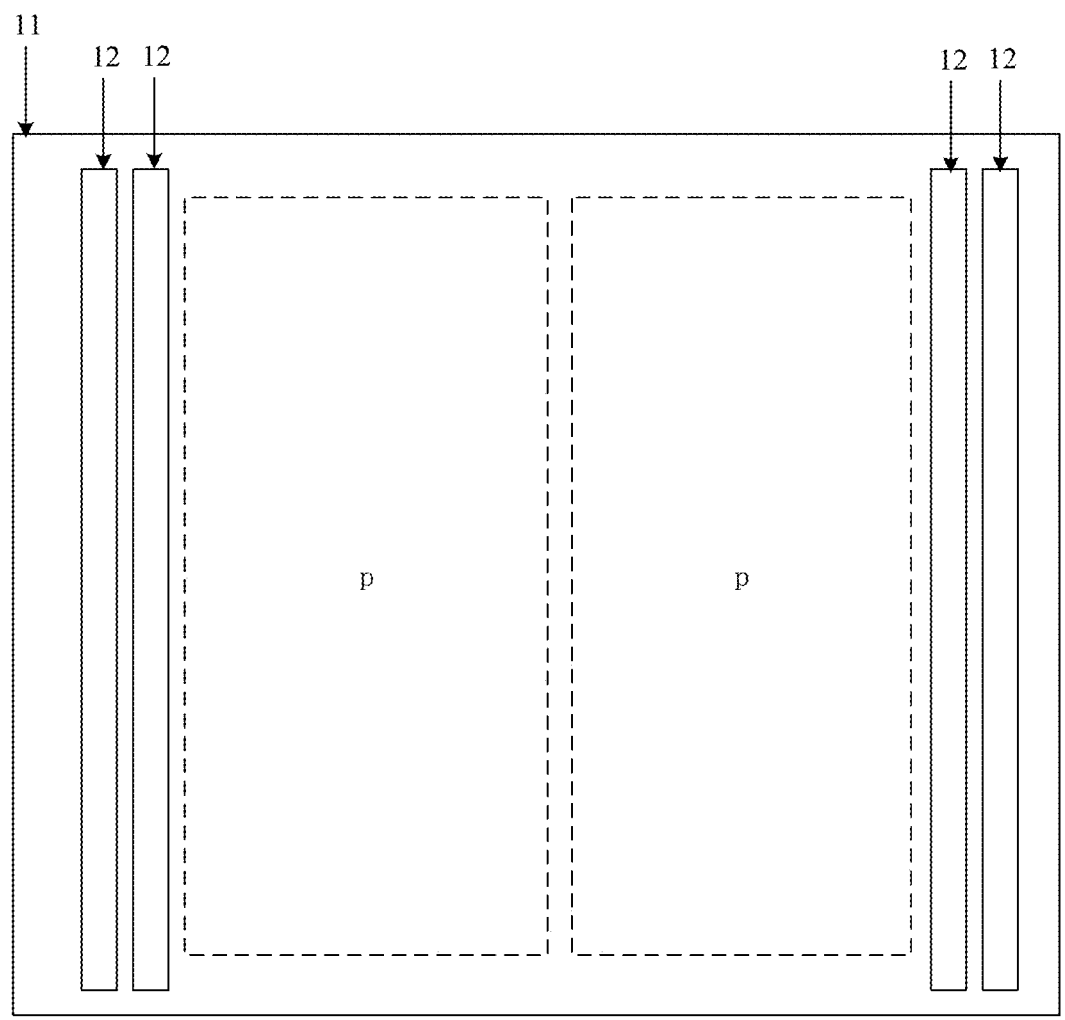
FIG. 3 is a schematic structural diagram of an array substrate in accordance with an embodiment of the present disclosure.

FIG. 3 is a schematic structural diagram of an array substrate in accordance with an embodiment of the present disclosure. The array substrate 10 may include a base substrate 11 with a plurality of sub-pixel regions p arranged thereon in multiple rows and columns.

A plurality of data lines 12 are located on the base substrate 11. Each data line 12 corresponds to at least one sub-pixel region p in any column of the sub-pixel regions p. Any row of sub-pixel regions p include a plurality of sub-pixel region pairs, and each sub-pixel region pair includes two adjacent sub-pixel regions p (the two sub-pixel regions p shown in FIG. 3 belong to the same sub-pixel region pair). Any two of the sub-pixel region pairs include different sub-pixel regions (that is, any two of the sub-pixel region pairs will not include the same sub-pixel region). The two data lines 12 corresponding to the two sub-pixel regions p are respectively located at different sides of the two sub-pixel regions p in a row direction (a transverse direction shown in FIG. 3). It can be seen from FIG. 3 that in the two adjacent sub-pixel regions p, the data line 12 corresponding to the sub-pixel region p on the left side is located at its left side, and the data line 12 corresponding to the sub-pixel region p on the right side is located at its right side.

A common electrode and a plurality of pixel electrodes are located on the base substrate 11.

There is no data line between the two sub-pixel regions p shown in FIG. 3. Owing to no interference from the data line, a distance between the pixel electrodes in the two sub-pixel regions p may be shorter, such that an electrical-field-free region between the two sub-pixel regions is reduced. Further, black shadow lines between the sub-pixel regions are reduced.

Figure 4:
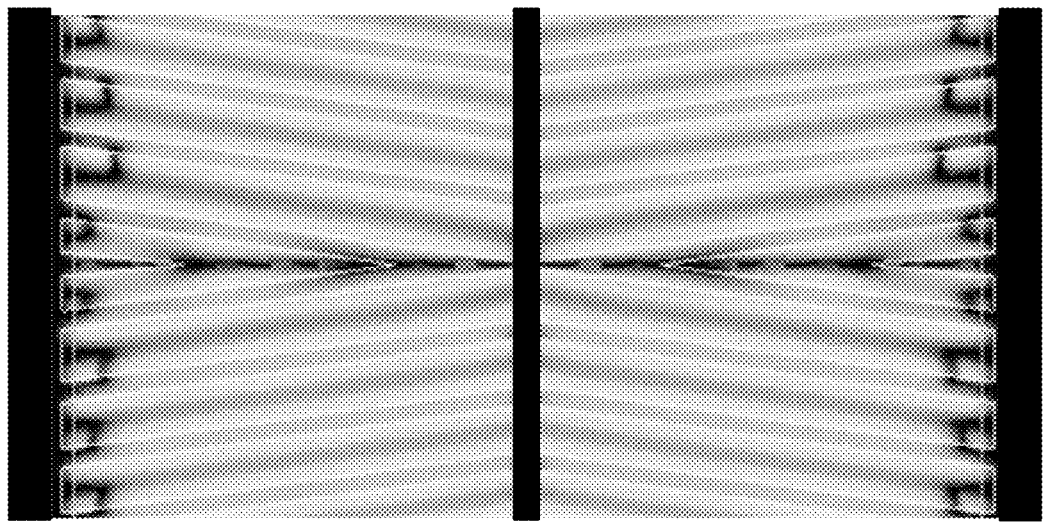
FIG. 4 is a schematic diagram showing black shadow lines of the array substrate shown in FIG. 3.

As shown in FIG. 4, which is a schematic structural diagram of an array substrate in accordance with an embodiment of the present disclosure, white regions are sub-pixel regions, and black regions between the white regions are black shadow lines. It can be seen that because there is no data line between the white regions, the black shadow lines between the white regions are significantly narrowed (compared with the array substrate shown in FIG. 2).

Figure 5:
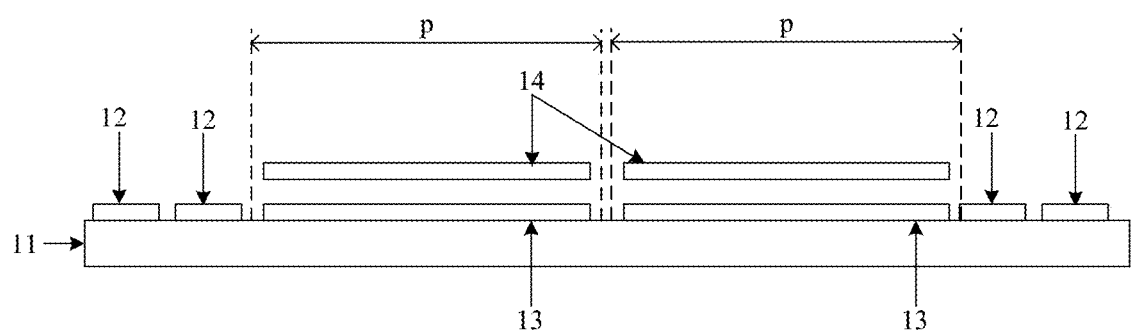
FIG. 5 is a side view of the array substrate shown in FIG. 3.

As shown in FIG. 5, which is a cross-sectional view of the array substrate shown in FIG. 3, a pixel electrode 13 and a common electrode 14 are respectively disposed in two sub-pixel regions p of the array substrate 11. Two data lines 12 are respectively disposed at two sides of the two sub-pixel regions p. It can be seen that a distance between pixel electrodes 13 and a distance between common electrodes 14 in the two adjacent sub-pixel regions p are relatively short.

In summary, in the array substrate provided by the present embodiment, since the two data lines corresponding to the two adjacent sub-pixel regions in the same row are respectively disposed at different sides of the two sub-pixel regions in a row direction, a structure that no data line is disposed between the two adjacent sub-pixel regions exists on the base substrate. In this structure, the pixel electrodes of the two adjacent sub-pixel regions may be relatively close to each other. Further, a region that is unable to produce an electric field will be relatively small, such that a display panel made by the array substrate has a good display effect. Thus, the problem that a display panel in the related art has a poor display effect is solved, and the display effect of the display panel made by the array substrate is improved.

Figure 6:
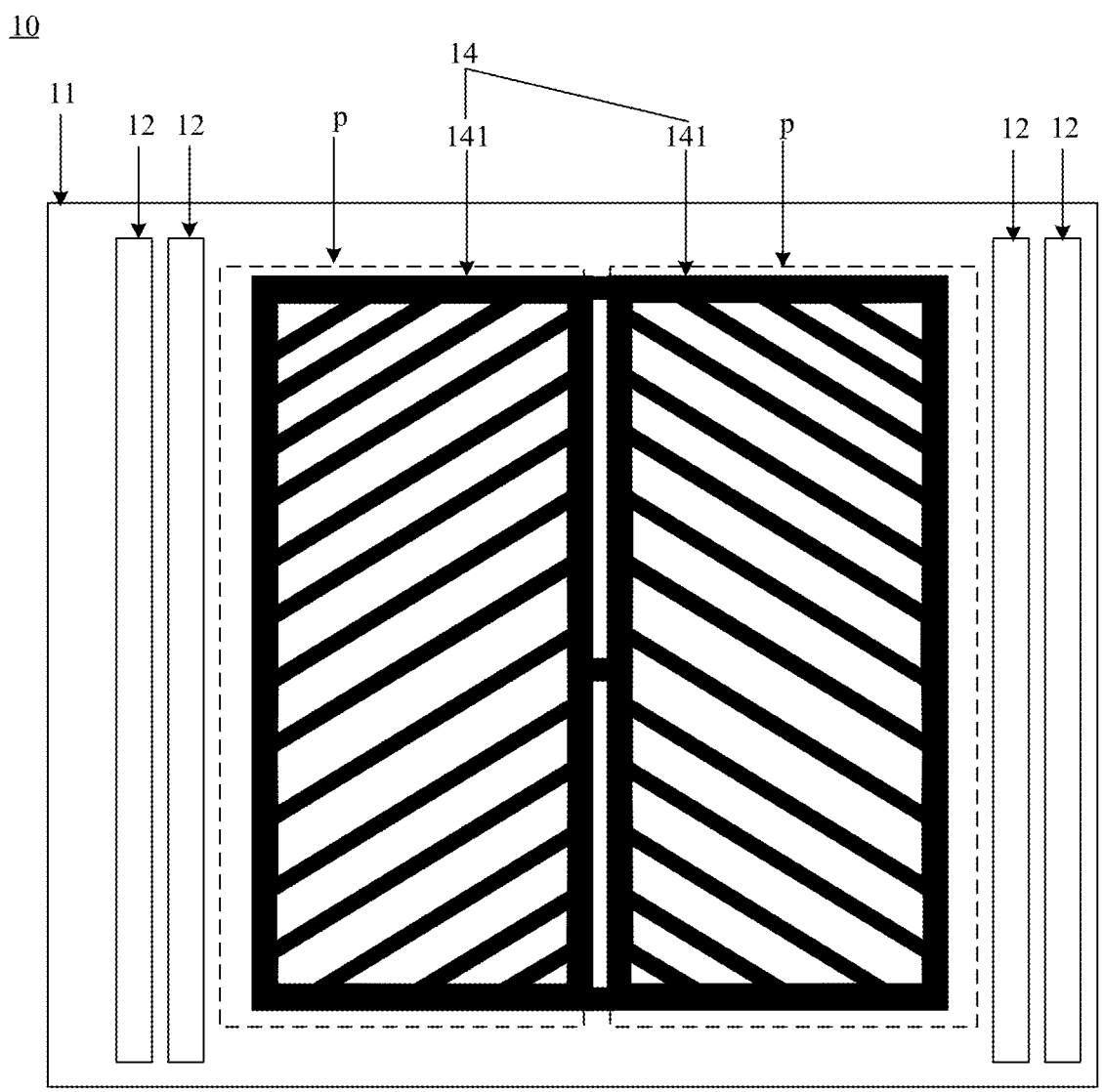
FIG. 6 is a schematic structural diagram of another array substrate in accordance with an embodiment of the present disclosure.

FIG. 6 is a schematic structural diagram of another array substrate in accordance with an embodiment of the present disclosure. The array substrate is obtained by making some adjustments to the array substrate shown in FIG. 5.

Optionally, the common electrode 14 includes a plurality of comb-shaped sub-electrodes 141. The plurality of comb-shaped sub-electrodes 141 is in one-to-one correspondence with the plurality of sub-pixel regions p. A region where an orthographic projection of any one of the comb-shaped sub-electrodes 141 on the substrate 11 is located overlaps the sub-pixel region p corresponding to the any one of the comb-shaped sub-electrodes. After the orthographic projection of the comb sub-electrode on the base substrate overlaps the sub-pixel region, a transverse electric field may be formed with the pixel electrode in the sub-pixel region to control the liquid crystal layer.

The comb sub-electrode 141 includes a plurality of strip-shaped gaps, such that the comb sub-electrode 141 and the pixel electrode therebelow may generate a transverse electric field to control the liquid crystal layer of the display panel.

Optionally, as shown in FIG. 6, no data line is provided between the two adjacent sub-pixel regions p, and the common electrode will not affect the data line, so the common electrode may be disposed above a region between the two adjacent sub-pixel regions p. That is, orthographic projections (not shown in FIG. 6) of the two comb-shaped sub-electrodes 141 corresponding to the two sub-pixel regions p in any one of the sub-pixel region pair on the substrate 11 overlap the region between the two sub-pixel regions.

In the above structure, the area of the common electrode is increased, the area of a region, in which no common electrode is disposed between the sub-pixel regions, is reduced, and further the area of the electric-field-free region between the sub-pixel regions is reduced.

Figure 7:
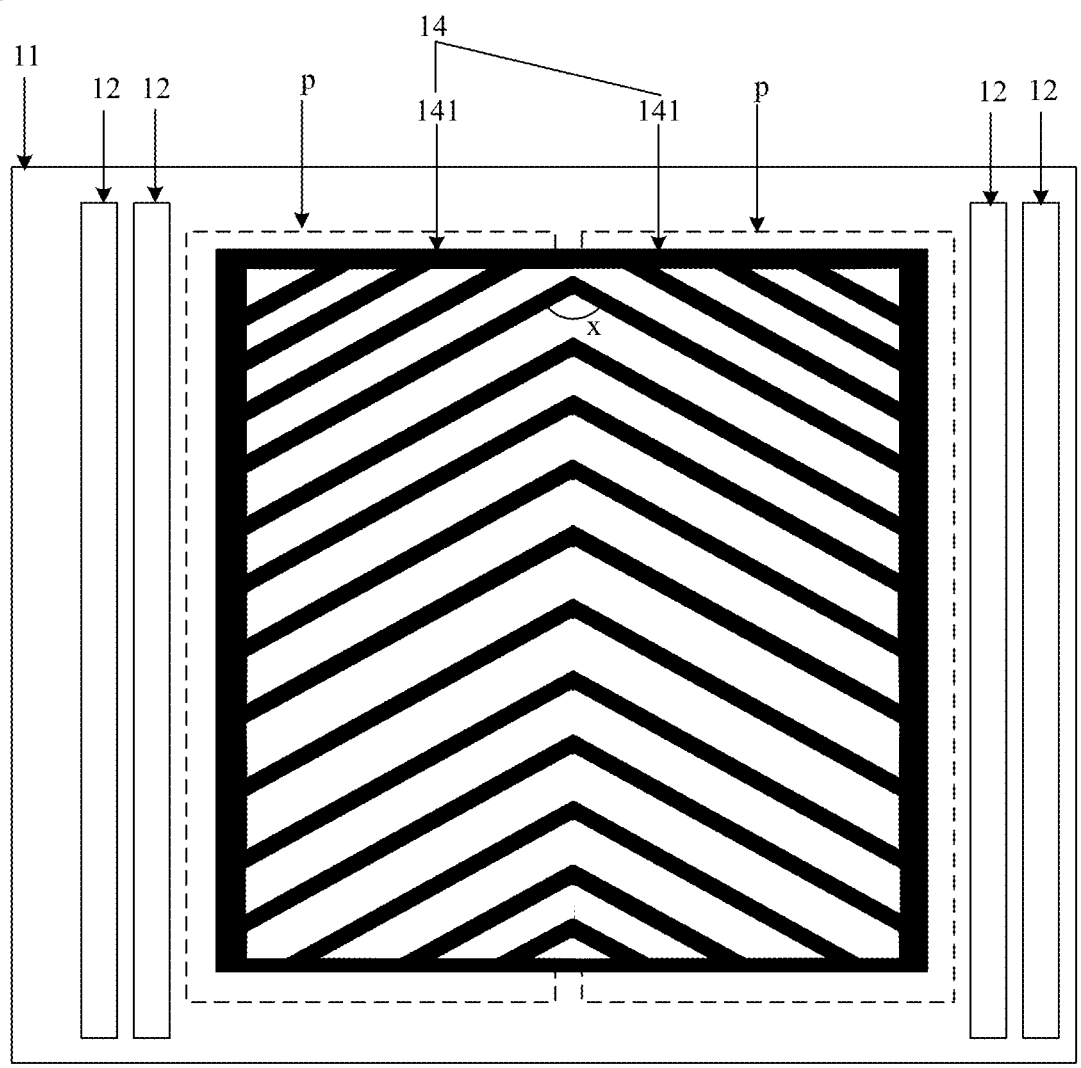
FIG. 7 is a schematic structural diagram of yet another array substrate in accordance with an embodiment of the present disclosure.

In the array substrate shown in FIG. 1, since the data line D is provided between the two adjacent sub-pixel regions p, if the comb-shaped sub-electrodes corresponding to the two adjacent sub-pixel regions p are connected by a wire, this wire will inevitably cross the data line and affect the data line and the comb-shaped sub-electrodes. However, in the array substrate shown in FIG. 6, since no data line is provided between the two adjacent sub-pixel regions p, the two comb-shaped sub-electrodes 141 may be electrically connected to each other. FIG. 6 shows a structure in which the two comb-shaped sub-electrodes 141 are electrically connected by the wire. However, the two comb-shaped sub-electrodes 141 may also be electrically connected in other ways. Exemplarily, as shown in FIG. 7, which is a schematic structural diagram of yet another array substrate in accordance with an embodiment of the present disclosure, the two comb-shaped sub-electrodes 141 are of an integral structure. In this structure, the two comb-shaped sub-electrodes cover the region between the corresponding two sub-pixel regions, thereby further reducing the area of the electric-field-free region between the sub-pixel regions.

In FIG. 7, each of the comb-shaped sub-electrodes 141 includes a plurality of parallel strip-shaped structures (i.e., black strip portions in FIG. 7). The comb-shaped sub-electrodes 141 are exactly composed of these strip-shaped structures. The common electrode may include a frame for fixing the strip-shaped structures in the comb-shaped sub-electrodes 141.

On the array substrate shown in FIG. 7, the strip-shaped structures in the two comb-shaped sub-electrodes 141 corresponding to the two sub-pixel regions p in each sub-pixel region pair form a first specified angle x that may be greater than 90° and smaller than 180°. Within this angle range, the comb sub-electrode may load liquid crystals in the display panel with pretilt angles so as to speed up deflection of the liquid crystals.

Figure 8:
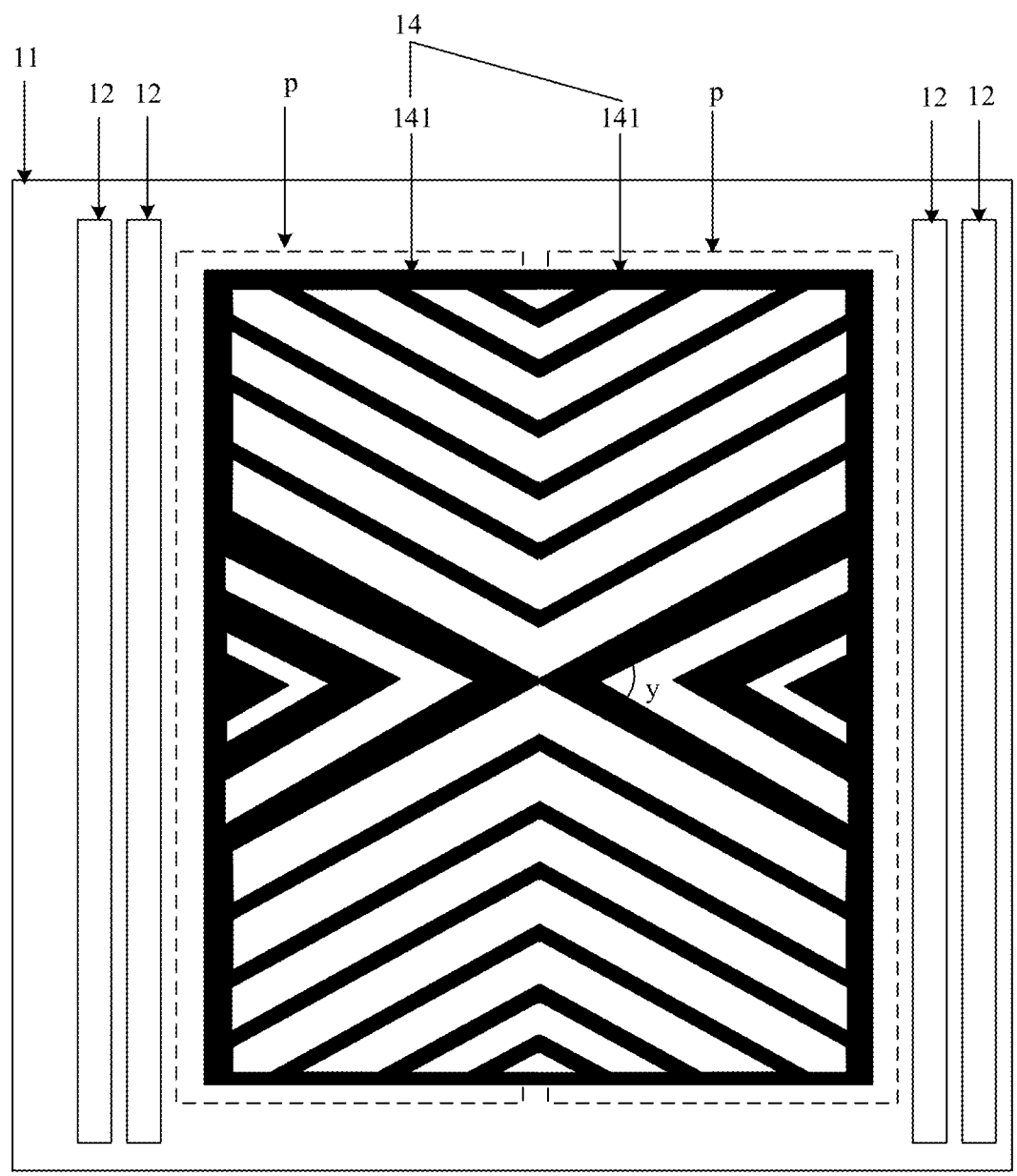
FIG. 8 is a schematic structural diagram of yet another array substrate in accordance with an embodiment of the present disclosure.

The common electrode in the array substrate shown in FIG. 7 is a common electrode of a dual-domain structure in accordance with an embodiment of the present disclosure, but the common electrode may be of other structures. FIG. 8 is a schematic structural diagram of yet another array substrate in accordance with an embodiment of the present disclosure.

Each comb sub-electrode 141 includes two strip-shaped structure sets (the upper half of each comb sub-electrode 141 in FIG. 8 is a strip-shaped structure set, and its lower half is another strip-shaped structure set). Each strip-shaped structure set includes a plurality of parallel strip-shaped structures (i.e., black strip portions in FIG. 8), and the strip-shaped structures in the two strip-shaped structure sets form a second specified angle y. Optionally, the second specified angle y may be greater than 0° and smaller than 90°.

The strip-shaped structures in the four strip-shaped structure sets of the two comb-shaped sub-electrodes 141 corresponding to the two sub-pixel regions p in the sub-pixel region pair are arranged in an x manner. The common electrode in the array substrate shown in FIG. 8 is a four-domain common electrode in accordance with an embodiment of the present disclosure.

Figure 9:
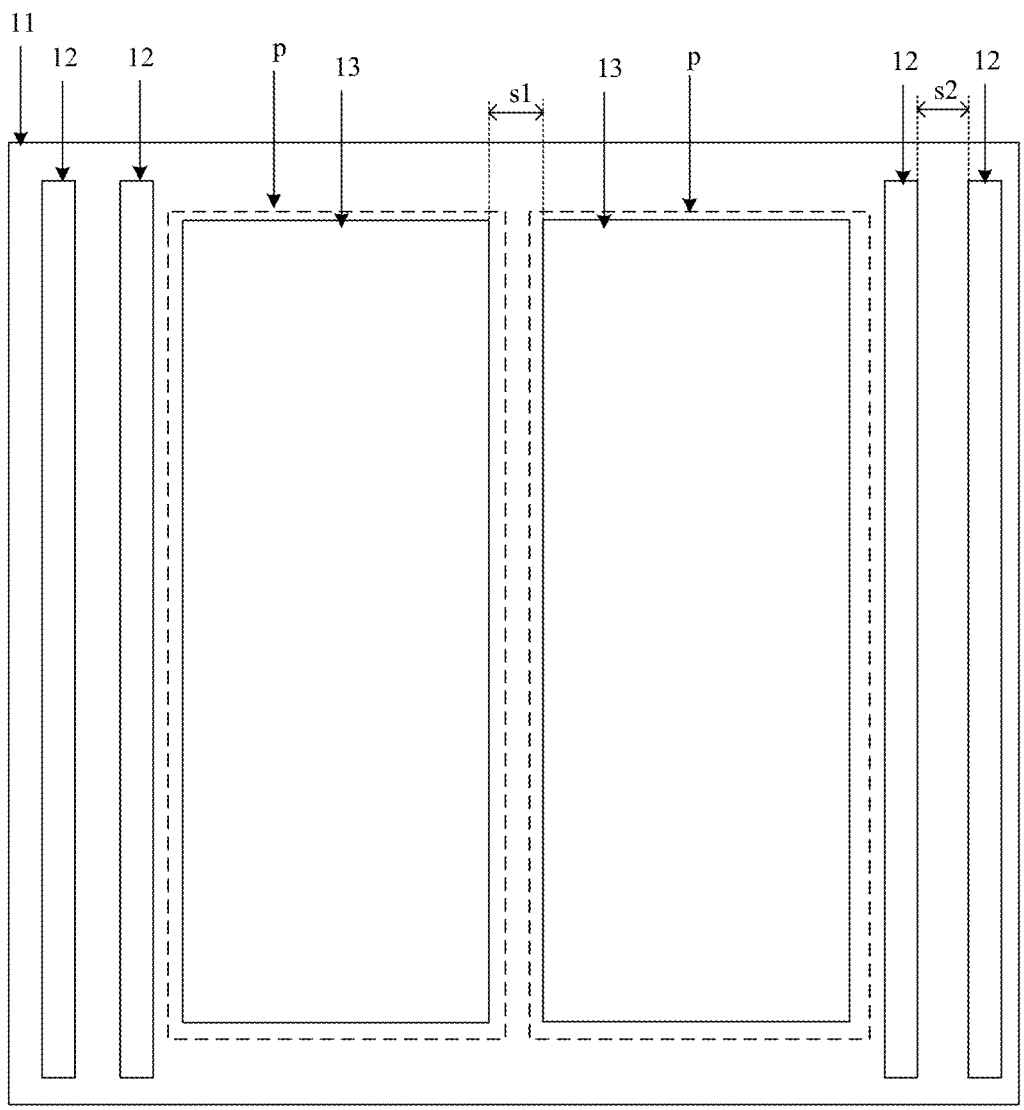
FIG. 9 is a schematic structural diagram of yet another array substrate in accordance with an embodiment of the present disclosure.

Optionally, FIG. 9 is a schematic structural diagram of yet another array substrate in accordance with an embodiment of the present disclosure. A plurality of pixel electrodes 13 are in one-to-one correspondence with a plurality of sub-pixel regions p. An orthographic projection of each pixel electrode 13 on a base substrate 11 is located in a sub-pixel region p corresponding to the pixel electrode 13. A minimum distance s1 between the two pixel electrodes 13 corresponding to the two sub-pixel regions p in the sub-pixel region pair is greater than or equal to a first specified distance. The first specified distance is a minimum distance by which the two pixel electrodes 13 will not affect each other.

Since the pixel electrodes in the different sub-pixel regions will severely affect each other after being conducted, the first specified distance may be a minimum distance by which the two pixel electrodes 13 will not be conducted. The first specified distance may generally be determined by the accuracy of a manufacture process of the two pixel electrodes. That is, the first specified distance may be greater than or equal to a minimum distance that can be achieved by the manufacture process. Exemplarily, the distance may be 3.0 micrometers to 3.5 micrometers. In this way, the two pixel electrodes will not affect each other. Compared with the distance h between the pixel electrodes in the two adjacent sub-pixel regions of the array substrate shown in FIG. 1, the distance between the pixel electrodes in the two adjacent sub-pixel regions of the present embodiment is obviously shorter. This can reduce the area of the electric-field-free region between the sub-pixel regions, reduce black shadow lines between the sub-pixel regions, and also improve the transmittance of the display panel.

Optionally, there may be a plurality of columns of sub-pixel regions on the array substrate 11, and a plurality of data lines are in one-to-one correspondence with the plurality of columns of sub-pixel regions. That is, each data line corresponds to one column of sub-pixel regions. In this structure, there may be two data lines between two adjacent sub-pixel region pairs. A distance s2 between the two data lines 12 is greater than or equal to a second specified distance. The second specified distance is a minimum distance by which the two data lines 12 will not affect each other. In this way, the data lines arranged together can be prevented from affecting each other. A reference may be made to the first specified distance for determination of the second specified distance, which will not be repeated herein.

Figure 10:
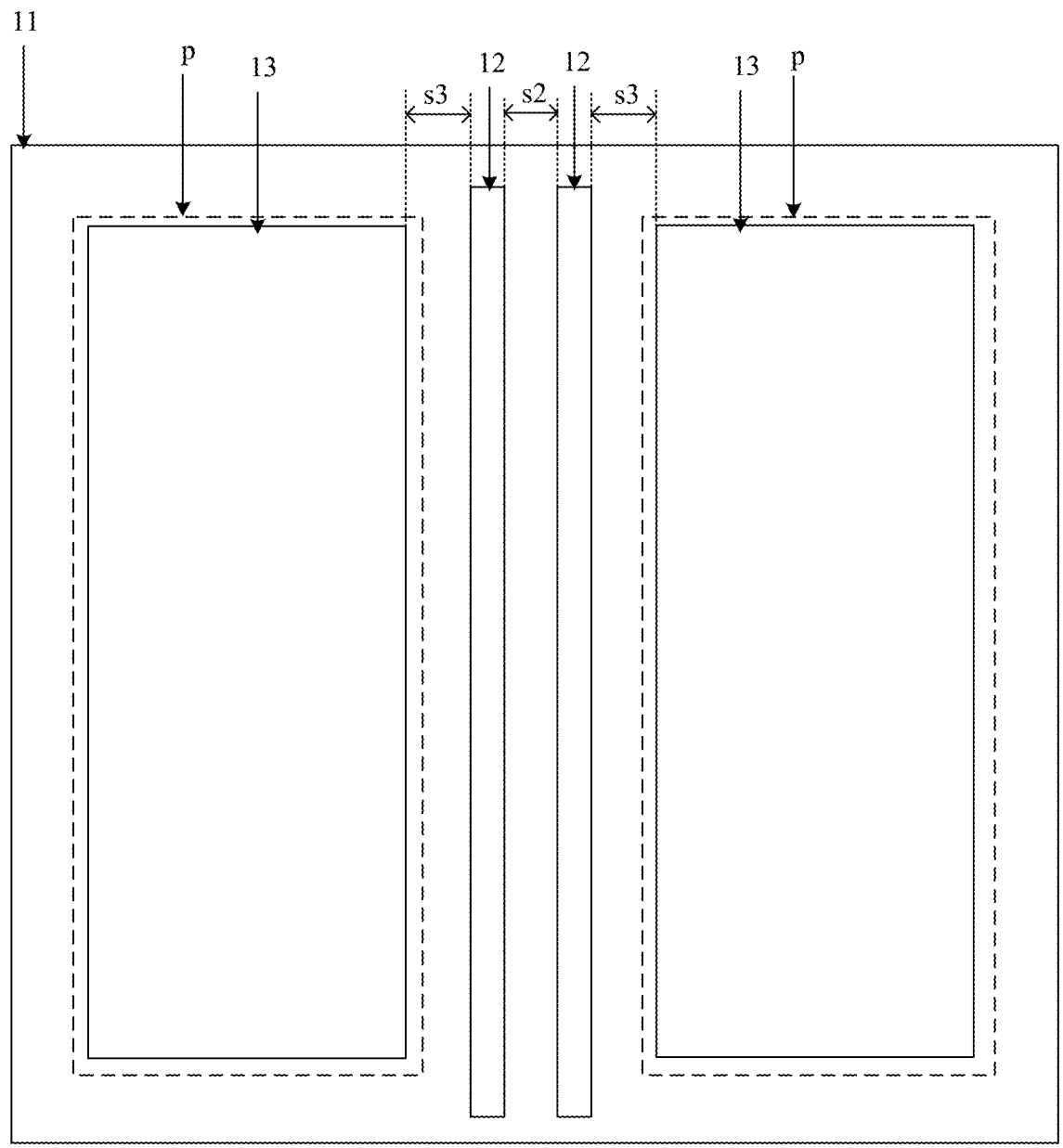
FIG. 10 is another schematic structural diagram of the array substrate shown in FIG. 9.

FIG. 10 is another schematic structural diagram of the array substrate shown in FIG. 9. A distance between the two pixel electrodes 13 at two sides of the two data lines 12 is greater than or equal to a fourth specified distance. The fourth specified distance is the sum of the second specified distance S2, widths of the two data lines 12 (i.e., the sum of widths of the two data lines 12) and two times of a third specified distance s3. The third specified distance s3 is a minimum distance by which the pixel electrodes on the base substrate will not affect the data lines.

Optionally, the plurality of comb-shaped sub-electrodes 141 is made of a transparent conductive material. Thus, the transmittance of the array substrate can be improved. The transparent conductive material may include indium tin oxide (ITO).

In addition, the array substrate provided by the present embodiment may further include structures such as gate metal, source metal and various insulating layers, which will not be repeated in the present embodiment.

The array substrate provided by the present embodiment may be applied to an advanced super-dimensional field switching (ADS) display panel or a fringe field switching (FFS) display panel.

In summary, in the array substrates provided by the embodiments of the present disclosure, since the two data lines corresponding to the two adjacent sub-pixel regions in the same row are respectively disposed at different sides of the two sub-pixel regions in a row direction, a structure that no data line is disposed between the two adjacent sub-pixel regions exists on the base substrate. In this structure, the pixel electrodes of the two adjacent sub-pixel regions may be relatively close to each other. Further, a region that is unable to produce an electric field will be relatively small, such that a display panel made by the array substrate has a good display effect. Thus, the problem that a display panel in the related art has a poor display effect is solved, and the display effect of the display panel made by the array substrate is improved.

Figure 11:
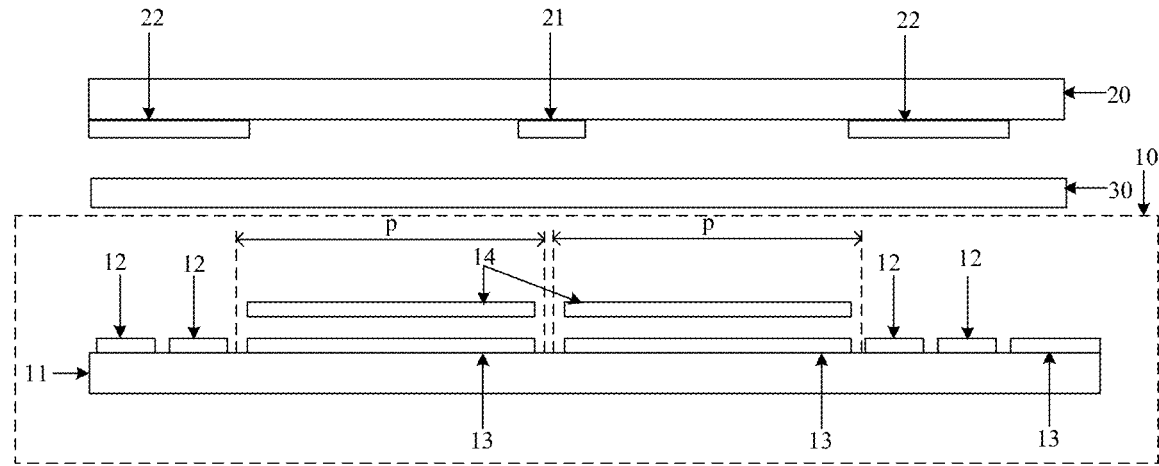
FIG. 11 is a schematic structural diagram of a display panel in accordance with an embodiment of the present disclosure.

FIG. 11 is a schematic structural diagram of a display panel in accordance with an embodiment of the present disclosure. The display panel may include a color filter substrate 20, a liquid crystal layer 30 and any one of the array substrates 10 provided in the above embodiments.

Optionally, a plurality of pixel electrodes 13 are in one-to-one correspondence with a plurality of sub-pixel regions p. An orthographic projection of each pixel electrode 13 on a base substrate 11 is located in a sub-pixel region p corresponding to the pixel electrode 13. A minimum distance s1 between the two pixel electrodes 13 corresponding to the two sub-pixel regions p in a sub-pixel region pair is greater than or equal to a first specified distance. The first specified distance is a minimum distance by which the two pixel electrodes will not affect each other.

A first black matrix 21 is disposed on the color filter substrate 20, and an orthographic projection of a region between the two pixel electrodes 13 (a data line is not provided between the two pixel electrodes 13) on the base substrate 11 is located in an orthographic projection of the first black matrix 21 on the base substrate 11. That is, the first black matrix can exactly cover the region between the two pixel electrodes 13 and prevent light emitted from the adjacent sub-pixel regions from affecting each other. A width of the first black matrix is positively related to a width of the region between the two pixel electrodes 13, and a minimum width of the first black matrix may be a width that can prevent cross color and light leakage between the adjacent sub-pixel regions. In addition, structures such as a planarization layer, a spacer and an indium tin oxide structure for shielding an electric field are further disposed on the color filter substrate, which will not be repeated in the present embodiment.

Compared with the display panel provided by the present embodiment, the related art has the following problems: since a distance between two adjacent pixel electrodes (referring to the distance h shown in FIG. 1) is relatively long, the black matrix configured to cover the region between the two sub-pixel regions is relatively wide, which results in relatively wide black shadow lines between the sub-pixel regions and in turn results in a relatively low white-state brightness of the display panel. However, in the display panel provided by the present embodiment, the black matrix has a small light-shielding area, which makes the display panel have a high white-state brightness, a low black-state brightness, a high contrast ratio and a good overall display effect.

Exemplarily, when the array substrate in the display panel is the array substrate shown in FIG. 7, an optical simulation by software shows that the white-state brightness of the display panel is increased by 5%, the dark-state brightness is decreased by 5% and the contrast ratio is increased by 10%. When the array substrate in the display panel is the array substrate shown in FIG. 8, it is found by simulation that the black-state brightness of the display surface provided by the present embodiment is decreased by 3%, the white-state brightness is increased by 2.8%, and the contrast ratio is increased by 6.5%.

Optionally, a second black matrix 22 is further disposed on the color filter substrate 20, and an orthographic projection of a region between the two pixel electrodes 13 at two sides of any data line 12 on the base substrate 11 is located in an orthographic projection of the second black matrix 22 on the base substrate 11. That is, the second black matrix 22 can cover the region between the two pixel electrodes 13. Although the second black matrix 22 is wider than that of a display panel in the related art, the area of the overlapping region between the region not covered by the black matrix and the pixel electrode is not reduced.

In addition, a vertical contrast ratio and a side-view contrast ratio of the display panel provided by the present embodiment are improved by reducing the size of the black shadow lines.

Figure 12:
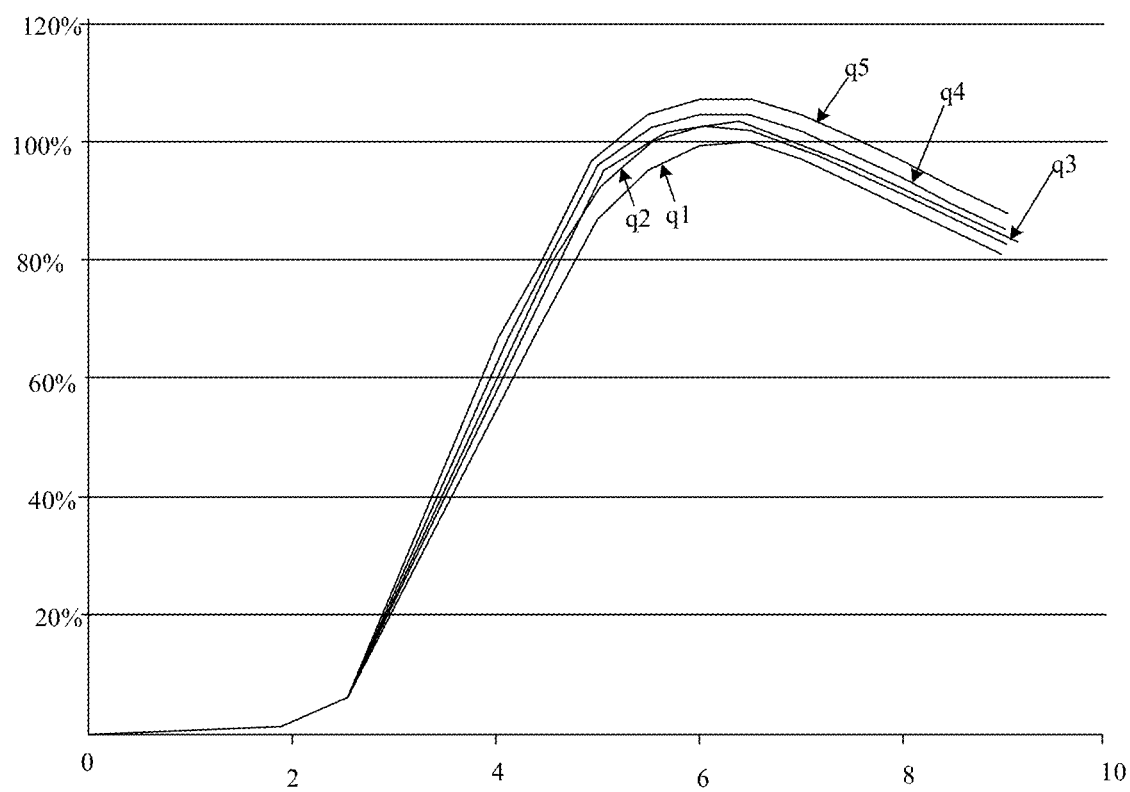
FIG. 12 is a schematic diagram showing brightness of a display panel in accordance with an embodiment of the present disclosure.

FIG. 12 is a schematic diagram showing brightness of a display panel in accordance with an embodiment of the present disclosure. The horizontal axis indicates voltage (the voltage is applied to the liquid crystal layer) in the unit of volt, and the vertical axis indicates a relative vessel percentage of brightness based on the fact that a maximum brightness of a display panel (e.g., a display panel made by the array substrate shown in FIG. 1) is 100%. In FIG. 12, curve q1 is a brightness curve of a display panel made by the array substrate shown in FIG. 1; curve q2 and curve q3 are brightness curves of a display panel made by the array substrate shown in FIG. 8; and curve q2 differs from curve q3 in that curve q2 is in a case that the distance between the pixel electrodes in the adjacent sub-pixel regions of the array substrate shown in FIG. 8 is set to be the same as that of the array substrate shown in FIG. 1, and curve q3 is in a case that the distance between the pixel electrodes in the adjacent sub-pixel regions is set to the first specified distance.

Curve q4 and curve q5 are brightness curves of the display panel made by the array substrate shown in FIG. 7. Curve q4 is in a case that the distance between the pixel electrodes in the adjacent sub-pixel regions is set to be the same as that of the array substrate shown in 1. Curve q5 is in a case that the distance between the pixel electrodes in the adjacent sub-pixel regions is set to the first specified distance. It can be seen that the maximum brightness shown by curve q5 is significantly higher than maximum brightness of other display panels, which indicates that this maximum brightness is significantly improved.

Figure 13:
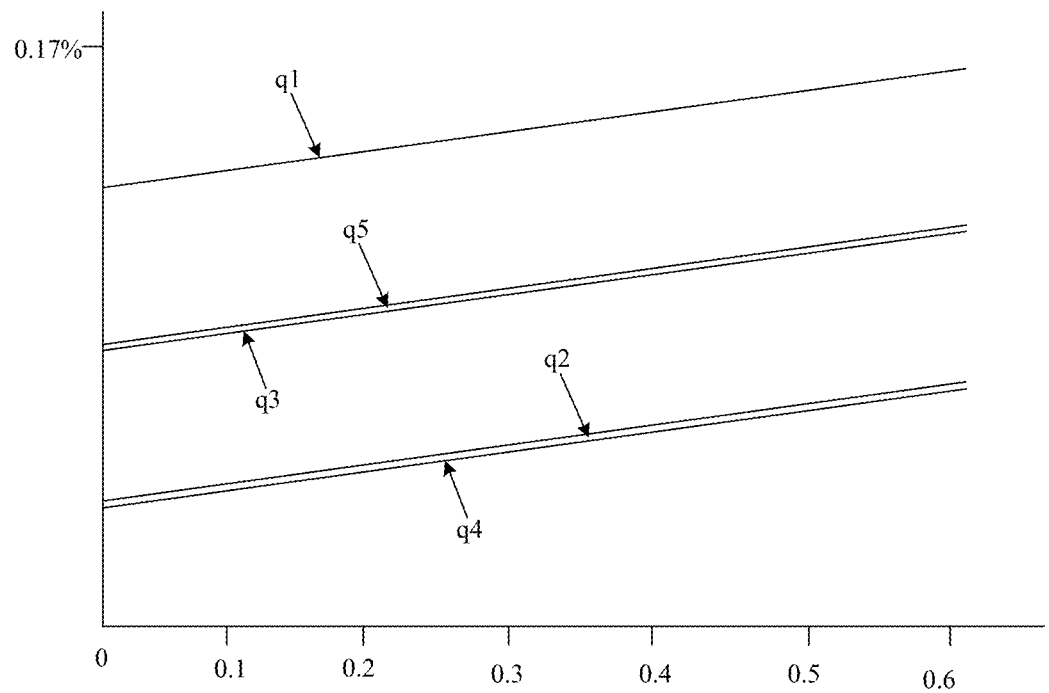
FIG. 13 is a partial schematic diagram of the schematic diagram shown in FIG. 12.

FIG. 13 is a brightness curve diagram of an interval (this interval may be deemed as the dark-state brightness) in which the horizontal axis indicates 0 volt to 0.6 volts in the curve diagram shown in FIG. 12. The brightness indicated by curves q3 and q5 are close (for the ease of illustration in FIG. 13, curve q5 is made higher than curve q3, but this is not a limitation to curves q5 and q3), and the brightness indicated by curves q2 and q4 are close (for the ease of illustration in FIG. 13 curve q2 is made higher than curve q4, but this is not a limitation to curves q2 and q4). The brightness indicated by curve q1 is about 3% higher than that of curves q3 and q5, and is about 5% higher than that of curves q2 and q4. As can be seen from FIG. 13, the dark-state brightness of the display panel provided by the present embodiment is significantly lower than that of the display panel made by the array substrate shown in FIG. 1.

Figure 14:
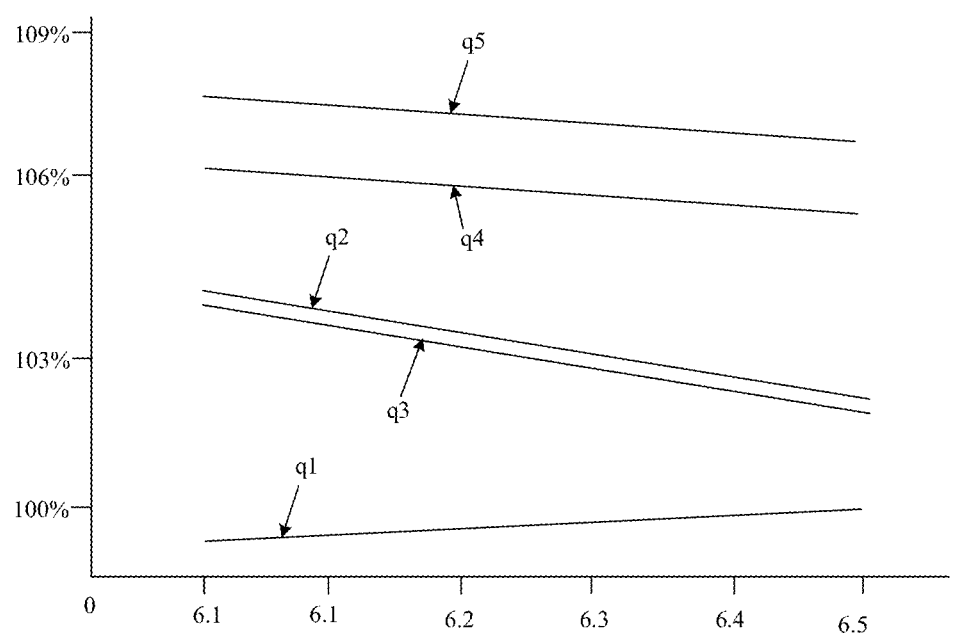
FIG. 14 is another partial schematic diagram of the schematic diagram shown in FIG. 12.

FIG. 14 is a brightness curve diagram of a 6 volt-6.6 volt interval (this interval may be deemed as a maximum-brightness interval), in which the brightness of curve q2 is about 3% higher than that of curve q1, the brightness of curve q3 is about 2.5% higher than that of curve q1, the brightness of curve q5 is about 8% higher than that of curve q, and the brightness of curve q4 is about 5% higher than that of curve q1. As can be seen from FIG. 14, the maximum brightness of the display panel provided by the present embodiment is significantly higher than that of the display panel made by the array substrate shown in FIG. 1.

Figure 15:
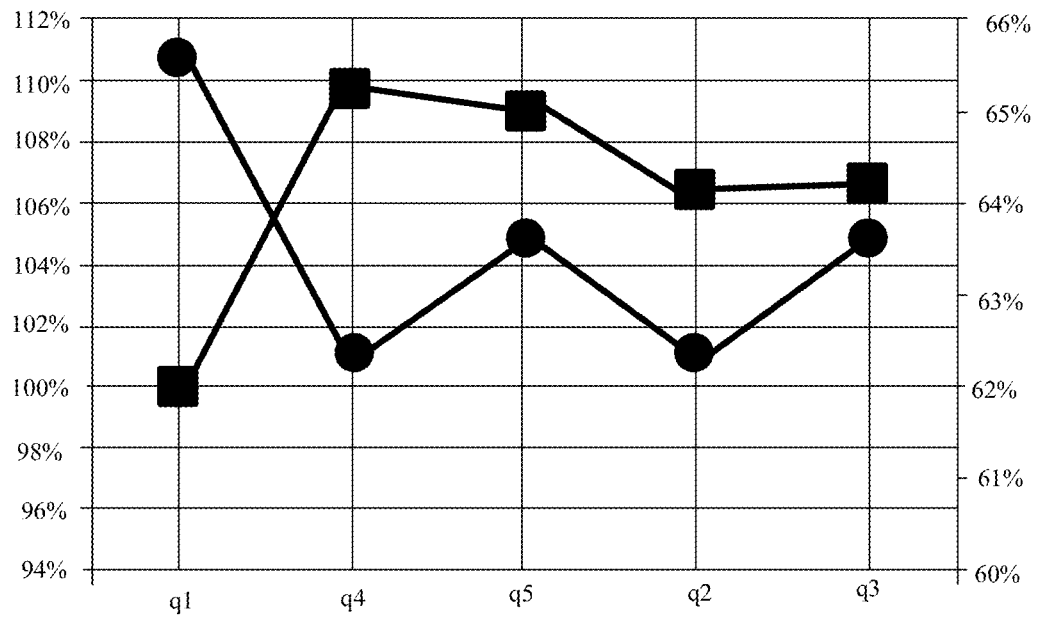
FIG. 15 is a tendency chart of an aperture ratio of a contrast ratio of a display panel in accordance with an embodiment of the present disclosure.

FIG. 15 is a tendency chart of aperture ratios and contrast ratios of the display panels corresponding to the curves in the curve diagram shown in FIG. 12. The horizontal axis indicates the curves corresponding to various display panels, the vertical axis on the left side indicates the contrast ratio based on the fact that the contrast ratio of the display panel corresponding to curve q1 is 100%, and the vertical axis on the right side indicates the aperture ratio (the aperture ratio is an actual value). Black circular symbols indicate the aperture ratios, and black square symbols indicate the contrast ratios. Exemplarily, the aperture ratio of the display panel corresponding to curve q1 approximately ranges from 65% to 66%, and its contrast ratio is 100%. It can be seen that the contrast ratio of the display panel provided by the present embodiment is significantly higher than that of the display panel made by the array substrate shown in FIG. 1.

Figure 16:
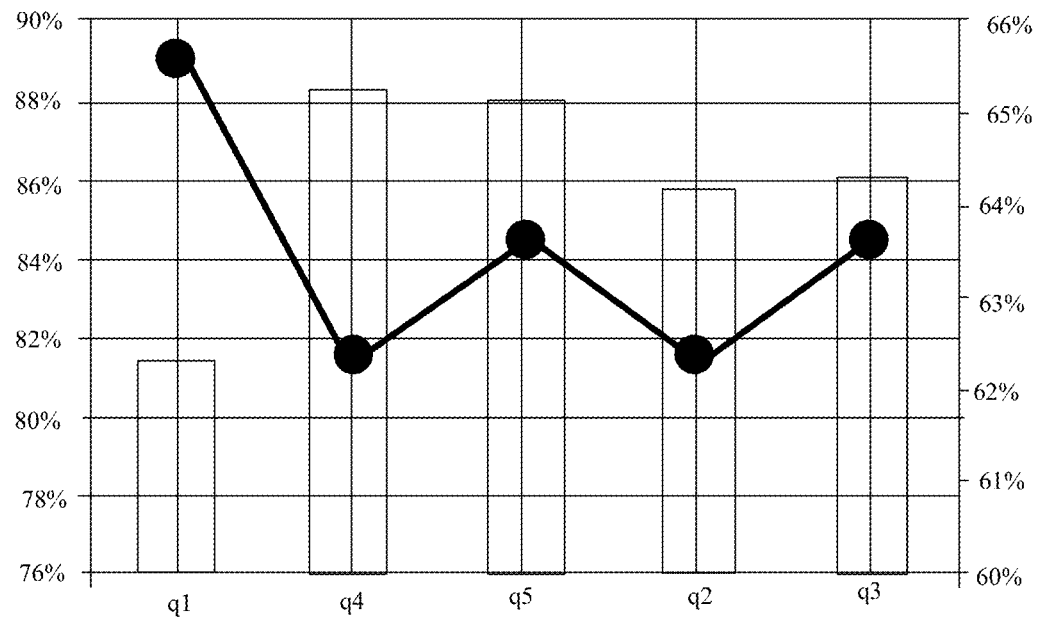
FIG. 16 is a schematic diagram of an aperture ratio and liquid crystal efficiency of a display panel in accordance with an embodiment of the present disclosure.

FIG. 16 is a tendency chart of aperture ratios and liquid crystal efficiency of the display panels corresponding to the curves in the curve diagram shown in FIG. 12. The horizontal axis indicates the curves corresponding to various display panels. The vertical axis on the left side indicates the liquid crystal efficiency. The liquid crystal efficiency is a parameter used to indicate the ability of the liquid crystal layer to deflect light. The higher the liquid crystal efficiency is, the higher the light deflecting ability of liquid crystals is. The vertical axis on the right side indicates the aperture ratio (the aperture ratio is an actual value). Black circular symbols indicate the aperture ratios, and the height of a rectangular frame indicates the liquid crystal efficiency. It can be seen that the liquid crystal efficiency of the display panel made by the array substrate shown in FIG. 1 (i.e., the liquid crystal efficiency indicated by curve q1) ranges from 80% to 82%, and the liquid crystal efficiency of the display panel provided by the present embodiment is 85% or above, which are significantly higher than the liquid crystal efficiency of the display panel made by the array substrate shown in FIG. 1.

Figure 17:
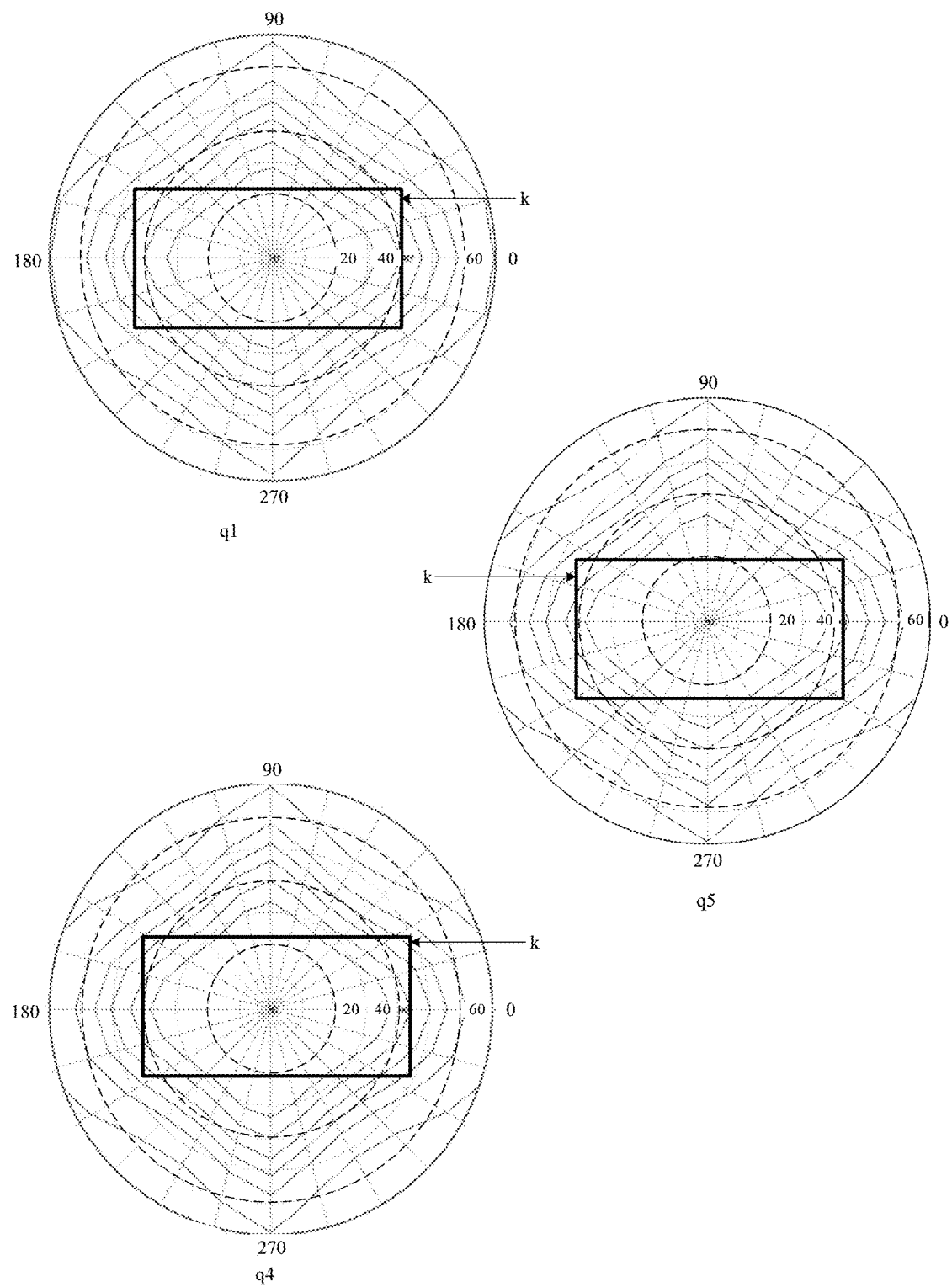
FIG. 17 is a schematic diagram of contrast ratios of a display panel at various angles in accordance with an embodiment of the present disclosure.

FIG. 17 is a schematic diagram showing contrast ratios, at various angles, of the display panels corresponding to curves q1, q4 and q5 in the curve diagram shown in FIG. 12. A circular graph is divided into multiple regions by multiple solid lines, and the regions closer to the interior indicate higher contrast ratios. An outer edge of the circle graph indicates an angle between an orthographic projection of an observing sight line on a display surface of the display panel and one edge of the display panel, and an internal dashed circle indicates angles between the observing sight line and the display surface of the display panel, including 20°, 40° and 60° from the inside out. A rectangular frame k indicates requirements on the contrast ratio of the display panel. The larger the area of a region surrounded by the solid line in the center of the circle graph in the rectangular frame k, the higher the contrast ratio of the display panel at various angles is, and the better a display effect is. It can be seen from FIG. 17 that the contrast ratios of the display panels corresponding to curves q5 and q4 at various angles are better than those of the display panel corresponding to curve q1 and made by the array substrate shown in FIG. 1.

It can be seen from the data shown in FIGS. 12 to 17 that the performance in various aspects of the display panel provided by the present embodiment is superior to the display panel made by the array substrate shown in FIG.

In summary, the display panel provided by the present embodiment includes the array substrate. Since the two data lines corresponding to the two adjacent sub-pixel regions in the same row are respectively disposed at different sides of the two sub-pixel regions in a row direction, a structure that no data line is disposed between the two adjacent sub-pixel regions exists on the base substrate. In this structure, the pixel electrodes of the two adjacent sub-pixel regions may be relatively close to each other. Further, a region that is unable to produce an electric field will be relatively small, such that a display panel made by the array substrate has a good display effect. Thus, the problem that a display panel in the related art has a poor display effect is solved, and the display effect of the display panel made by the array substrate is improved.

It should be noted that in the accompanying drawings, for clarity of the illustration, the dimension of the layers and regions may be scaled up. It may be understood that when an element or layer is described as being "above" another element or layer, the described element or layer may be directly on the other element, or an intermediate layer may be arranged between the described element and the other element. In addition, it may be understood that when an element or layer is described as being "below" another element or layer, the described element or layer may be directly below the other element or layer, or at least one intermediate layer may be arranged between the described element or layer and the other element or layer. In addition, it may be further understood that when a layer or element is described as being arranged "between" two layers or elements, the described layer or element may be the only layer between the two layers or elements, or at least one intermediate layer or element may be arranged between the described element or layer and the two layers or elements. In the whole specification described above, like reference numerals denote like elements.

In the present disclosure, the terms "first" and "second" are used for descriptive purposes only and should not be construed to indicate or imply relative importance. The term "plurality" refers to two or more, unless explicitly defined otherwise.

The foregoing descriptions are merely optional embodiments of the present disclosure, and are not intended to limit the present disclosure. Within the spirit and principles of the disclosure, any modifications, equivalent substitutions, improvements, etc., are within the protection scope of the present disclosure.

What is claimed is:

1. An array substrate, comprising:
   a base substrate, wherein the base substrate is provided with a plurality of sub-pixel regions arranged in multiple rows and columns on the base substrate;
   a plurality of data lines, wherein the plurality of data lines are located on the base substrate, each of the plurality of data lines corresponds to at least one of any column of the sub-pixel regions, any row of the sub-pixel regions comprise a plurality of sub-pixel region pairs, each of the plurality of sub-pixel region pairs comprises two adjacent sub-pixel regions, any two of the plurality of sub-pixel region pairs comprise different sub-pixel regions, and two data lines corresponding to the two sub-pixel regions are located at different sides of the two sub-pixel regions in a row direction; and
   a common electrode and a plurality of pixel electrodes, which are located on the base substrate; and
   wherein the common electrode comprises a plurality of comb-shaped sub-electrodes, the plurality of comb-shaped sub-electrodes is in one-to-one correspondence with the plurality of sub-pixel regions, each of the plurality of comb-shaped sub-electrodes comprises a plurality of parallel strip-shaped structures, the plurality of parallel strip-shaped structures cover a region between two sub-pixel regions, and a transverse electric field is formed between the plurality of pixel electrode and the plurality of parallel strip-shaped structures to reduce an area of an electric-field-free region between the plurality of sub-pixel regions.

2. The array substrate according to claim 1, wherein the plurality of pixel electrodes are in one-to-one correspondence with the plurality of sub-pixel regions;
an orthographic projection of each of the plurality of pixel electrodes on the base substrate is located in a sub-pixel region corresponding to the pixel electrode;
a minimum distance between two pixel electrodes corresponding to the two sub-pixel regions is greater than or equal to a first specified distance; and
the first specified distance is a minimum distance by which the two pixel electrodes do not affect each other.

3. The array substrate according to claim 1, wherein the strip-shaped structures in the two comb-shaped sub-electrodes corresponding to the two sub-pixel regions form a first specified angle that is greater than 90° and smaller than 180°.

4. The array substrate according to claim 1, wherein each of the plurality of comb-shaped sub-electrodes comprises two strip-shaped structure sets, each of the two strip-shaped structure sets comprises a plurality of parallel strip-shaped structures, and strip-shaped structures of the four strip-shaped structure sets in the two comb-shaped sub-electrodes corresponding to the two sub-pixel regions are arranged in an x manner.

5. The array substrate according to claim 1, wherein an orthographic projection of any one of the plurality of comb-shaped sub-electrodes on the base substrate overlaps a sub-pixel region corresponding to the any one of the plurality of comb-shaped sub-electrodes.

6. The array substrate according to claim 1, wherein the two comb-shaped sub-electrodes are electrically connected.

7. The array substrate according to claim 1, in any row of the sub-pixel regions, a distance between the two data lines that are located between any two adjacent sub-pixel regions is greater than or equal to a second specified distance, and the second specified distance is a minimum distance by which the two data lines do not affect each other.

8. The array substrate according to claim 7, wherein a distance between the two pixel electrodes at two sides of the two data lines is greater than or equal to a fourth specified distance, the fourth specified distance is the sum of the second specified distance, widths of the two data lines and two times of a third specified distance, and the third specified distance is a minimum distance by which the pixel electrodes on the base substrate do not affect the data lines.

9. The array substrate according to claim 1, wherein the plurality of comb-shaped sub-electrodes is made of a transparent conductive material.

10. The array substrate according to claim 1, wherein the plurality of pixel electrodes are in one-to-one correspondence with the plurality of sub-pixel regions;
an orthographic projection of each of the plurality of pixel electrodes on the base substrate is located in a sub-pixel region corresponding to the pixel electrode;
a minimum distance between two pixel electrodes corresponding to the two sub-pixel regions is greater than or equal to a first specified distance; and
the first specified distance is a minimum distance by which the two pixel electrodes do not affect each other;
the strip-shaped structures in the two comb-shaped sub-electrodes corresponding to the two sub-pixel regions form a first specified angle that is greater than 90° and smaller than 180°, and the two comb-shaped sub-electrodes are electrically connected; and
an orthographic projection of any one of the plurality of comb-shaped sub-electrodes on the base substrate overlaps a sub-pixel region corresponding to the any one of the plurality of comb-shaped sub-electrodes.

11. A display panel, comprising a color filter substrate, a liquid crystal layer and an array substrate, wherein the array substrate comprises:
a base substrate, wherein the base substrate is provided with a plurality of sub-pixel regions arranged in multiple rows and columns on the base substrate;
a plurality of data lines, wherein the plurality of data lines are located on the base substrate, each of the plurality of data lines corresponds to at least one of any column of the sub-pixel regions; any row of the sub-pixel regions comprise a plurality of sub-pixel region pairs, each of the plurality of sub-pixel region pairs comprises two adjacent sub-pixel regions, any two of the plurality of sub-pixel region pairs comprise different sub-pixel regions, and two data lines corresponding to the two sub-pixel regions are located at different sides of the two sub-pixel regions in a row direction; and
a common electrode and a plurality of pixel electrodes, which are located on the base substrate; and
wherein the common electrode comprises a plurality of comb-shaped sub-electrodes, the plurality of comb-shaped sub-electrodes is in one-to-one correspondence with the plurality of sub-pixel regions, each of the plurality of comb-shaped sub-electrodes comprises a plurality of parallel strip-shaped structures, the plurality of parallel strip-shaped structures cover a region between two sub-pixel regions, and a transverse electric field is formed between the plurality of pixel electrode and the plurality of parallel strip-shaped structures to reduce an area of an electric-field-free region between the plurality of sub-pixel regions.

12. The display panel according to claim 11, wherein the plurality of pixel electrodes are in one-to-one correspondence with the plurality of sub-pixel regions;
an orthographic projection of each of the plurality of pixel electrodes on the base substrate is located in a sub-pixel region corresponding to the pixel electrode;
the color filter substrate is provided with a first black matrix; and
an orthographic projection of a region between the two pixel electrodes corresponding to the two sub-pixel regions on the base substrate is located in an orthographic projection of the first black matrix on the base substrate.

13. The display panel according to claim 11, wherein the color filter substrate is provided with a second black matrix and an orthographic projection of a region between the two pixel electrodes at two sides of any one of the data lines on the base substrate is located in an orthographic projection of the second black matrix on the base substrate.

14. The display panel according to claim 11, wherein the plurality of pixel electrodes are in one-to-one correspondence with the plurality of sub-pixel regions;
an orthographic projection of each of the plurality of pixel electrodes on the base substrate is located in a sub-pixel region corresponding to the pixel electrode;
a minimum distance between two pixel electrodes corresponding to the two sub-pixel regions is greater than or equal to a first specified distance; and the first specified distance is a minimum distance by which the two pixel electrodes do not affect each other;

the strip-shaped structures in the two comb-shaped sub-electrodes corresponding to the two sub-pixel regions form a first specified angle that is greater than 90° and smaller than 180°, and the two comb-shaped sub-electrodes are electrically connected;

an orthographic projection of any one of the plurality of comb-shaped sub-electrodes on the base substrate overlaps a sub-pixel region corresponding to the any one of the plurality of comb-shaped sub-electrodes.

15. A display device, comprising any one of the display panels as defined in claim 11.

\* \* \* \* \*